METHOD OF MAKING A TRANSISTOR CONTAINING A MULTIPLICITY OF DEPRESSIONS

Original Filed Nov. 20, 1958 2 Sheets-Sheet 1

INVENTOR.
EDWARD J. DIEBOLD
BY
OSTROLENK, FABER, GERB & SOFFEN
ATTORNEYS

Dec. 28, 1965 E. J. DIEBOLD 3,225,416

METHOD OF MAKING A TRANSISTOR CONTAINING A MULTIPLICITY OF DEPRESSIONS

Original Filed Nov. 20, 1958 2 Sheets-Sheet 2

INVENTOR.
EDWARD J. DIEBOLD

BY

OSTROLENK, FABER, GERB & SOFFEN
ATTORNEYS

United States Patent Office 3,225,416
Patented Dec. 28, 1965

3,225,416

METHOD OF MAKING A TRANSISTOR CONTAINING A MULTIPLICITY OF DEPRESSIONS

Edward J. Diebold, Palos Verdes Estates, Calif., assignor to International Rectifier Corporation, El Segundo, Calif., a corporation of California Original application Nov. 20, 1958, Ser. No. 775,313. Divided and this application Mar. 9, 1962, Ser. No. 178,764
1 Claim. (Cl. 29—25.3)

This application is a divisional application of my co-pending application Serial No. 775,313, filed November 20, 1958, now abandoned.

This invention relates to transistors and more particularly to the method of making power transistors and has for its object to provide a power transistor having good switching characteristics.

When using transistors in switching circuits, it is desirable that the transistor have good cooling characteristics and good current carrying capacity. If the amplification factor be low, the major current flow will be directly from the emitter to the collector with the greatest voltage drop occurring between the base and the collector. Under this circumstance, a major part of the heat will be dissipated on the collector.

In accordance with the present invention there is provided a transistor construction, and method of making it, which provides a heat sink on the collector capable of readily dissipating the heat in that locality.

According to a feature of the invention, a crystal semi-conductor wafer provided with P-N junctions is contacted on one side by a heat sink forming a contact for the collector, and on the opposite side by another contact which may also form a heat sink at the emitter. The base is contacted at a region more remote from the central region of the crystal where the emitter and collector are located.

The arrangement may be organized and mounted in a rugged construction wherein the semi-conductor crystal of the transistor is held in a sturdy housing, and the emitter and collector occupy a substantial area and are closely adjacent to each other. The base electrode, being of less importance in respect to heat dissipation and current, may be placed at a more remote position.

The foregoing and other features of the invention will be better understood from the following detailed description and the accompanying drawings of which:

Figure 1:
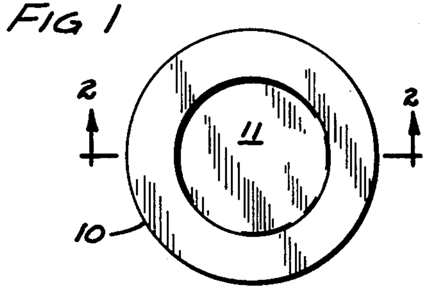
FIGURE 1 is a face view of a wafer of semi-conductor material used in the practice of the invention.
Figure 2:
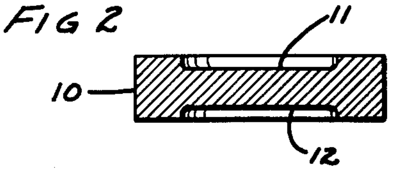
FIGURE 2 is a cross-section view taken at line 2—2 of FIGURE 1.

Referring to the drawings, FIGURES 1 and 2 show a wafer of semi-conductor material such as silicon which will ordinarily be selected for desirable properties of resistivity and lifetime. For the present purpose, the silicon is preferably of the P type.

It is convenient to make the wafer of FIGURE 1 and 2 from a flat circular disc of the semi-conductor crystal although it will be understood that it need not necessarily be circular in shape, but instead could be rectangular or square, or some other shape. To form the configuration of FIGURES 1 and 2, a flat circular disc which has been selected has flat grooves or depressions 11 and 12 centrally formed on opposite sides thereof. This may conveniently be done by etching, and a convenient way to perform the etching is by masking the ungrooved portions, which may be done in a well-known manner, for example, by a ceramic coating or coating of metal, so that the acid used for etching will act only in the central region where the groove is desired.

Figure 3:
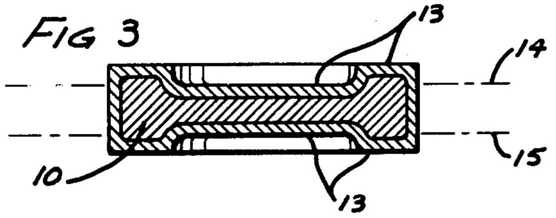
FIGURE 3 is a cross-section view showing the application of doping material to the external layer of the wafer of FIGURES 1 and 2.

FIGURE 3 shows the wafer of FIGURE 2 having at all of its surface a layer 13 containing a suitable doping material or impurity. The doping material becomes diffused with the silicon of the wafer in this layer. When phosphorous is used as the doping material for the surface of a wafer of P-type silicon, the silicon of the layer 13 becomes N-type silicon, and the well-known P-N junction is formed, at the interface between the P-type and N-type material. The manner of diffusing a substance such as phosphorous into the silicon is well understood in the art and needs no detailed discussion here. It may be done by, for example, making a slurry of phosphorous pentoxide, applying it to the surface of the wafer and then heating it; which will result in the introduction of phosphorous into the surface portion of the wafer.

Figure 4:
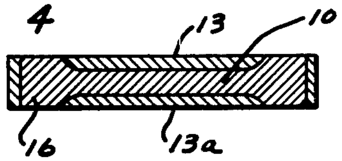
FIGURE 4 shows the arrangement of FIGURE 3 with portions thereof removed.

The next step in the preparation of the element is to remove all of the material except that between the broken lines 14 and 15 in FIG. 3; and this may be done by an ordinary lapping process or by etching with acid. In the event the etching process is used, the portions of the element which are not to be etched will first be masked according to usual practice. FIG. 4 shows the resulting form of the element after the removal of the material. The amount of the removal should be greater than the thickness of layer 13, so that there is left an annular ring 16 of the crystal semi-conductor material which no longer contains any of the N-type layer 13, while the layer 13 is left in the central grooves or depressions. In FIG. 4 the N-type layer is designated as 13 in groove 11 and as 13*a* in groove 12. To carry this out to best advantage, the amount of material removal should be substantially equal to the thickness of layer 13 in the grooves.

After completion of the operation represented by FIG. 4, there is now a silicon wafer in which phosphorous is diffused from both sides toward the center of the wafer, at their region of the grooves, and wherein the layers 13 and 13*a* are strongly N-type silicon while the silicon therebetween is P-type. Accordingly, the wafer is now in the form of a double junction of the form N-P-N with an annular rim surrounding it which is in direct contact with the P region of the double junction.

Figure 5:
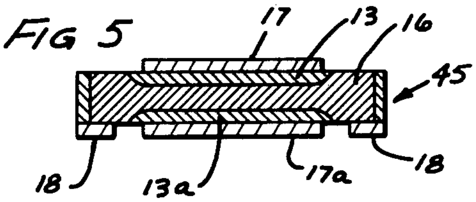
FIGURE 5 is a cross-section view of a transistor element comprising the application of contacting metal to the arangement of FIGURE 4.

FIGURE 5 shows the next step of coating the surfaces of layers 13 and 13*a* with coatings of molybdenum 17 and 17*a* respectively, and also of coating an annular ring 18 of molybdenum in contact with the annular P region 16.

The particular manner of applying the molybdenum is no part of the present invention, and ways of doing it are known. One way is to liquefy the molybdenum by heating it to a high temperature in the order of around 6000° C. and then spraying on the desired area in a vacuum while the portions which are not to be coated with molybdenum are suitably masked.

It will be recognized that there is provided by the arrangement of FIG. 5, a transistor element 45 of which the metallic members 17 and 17*a* comprise contacts for an emitter and a collector respectively, or vice versa, and the member 18 constitutes the contact for the base, which is the central P-type region. The transistor comprises a semi-conductor wafer having a body 10 of one of the conductivity types (assumed to be the P-type in this example) provided with portions at its opposite sides containing semi-conductor material of the opposite conductivity type (namely the surface layers 13 and 13*a* assumed in this example to be N-type in the hollows formed by depressions 11 and 12). The P-N junctions are at the interfaces between the body 10 and the respective layers 13 and 13*a*.

Figure 6:
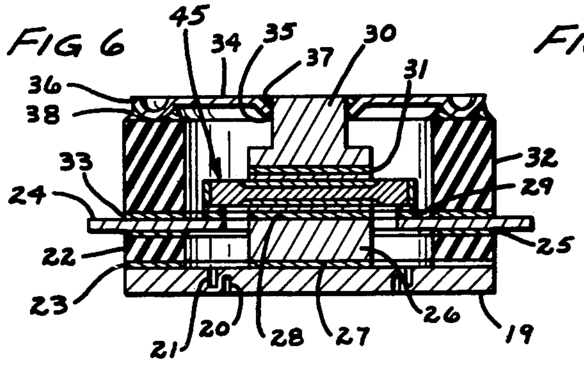
FIGURE 6 is a cross-section view showing a transistor arangement of FIGURE 4 mounted in a housing.

FIG. 6 shows a mounting and housing arrangement for the transistor 45 of FIG. 5. This comprises a base plate 19 preferably of a metal such as copper, which will serve as a good electrical conductor as well as a heat conductor; and the plate is preferably provided with annular slots 20 and 21 extending into the plate from opposite sides thereof for the purpose of providing a degree of flexibility. Mounted around the periphery at the top of plate 19 is an annular ring 22 of electrical insulating material, preferably aluminum oxide ceramic ($Al_2O_3$) attached to the base plate 24 by solder 23, and above the ring 22 there is fixed a metallic plate, preferably molybdenum, attached to ring 22 by solder 25. There is also fastened to plate 19 in a centrally located position a stem or plug 26, preferably of molybdenum, which is likewise affixed to the plate by solder 27. The upper surfaces of members 24 and 26 should be made flat and level in a plane, as by grinding to adapt them to receive the transistor without undue strain. The transistor wafer 45 of FIG. 5 is now attached to the assembly, which is done by attaching the molybdenum layer 17*a* to the stem 26 by a solder 28 and attaching the ring 18 to the plate 24 by solder 29.

The housing is completed by attaching a central stem or plug 30, preferably of molybdenum to the member 17 of the transistor by solder 31, and by attaching another annular insulating ring 32, preferably aluminum oxide ceramic, by solder 33 to the top of plate 24. A membrane 34 of an electrical conducting metal such as copper, and provided with a central opening 33 and a peripheral bead 36 is attached by placing the central opening 33 over the stem 30 and fastening by solder 37. The bead 36 is fastened to the top of the insulating ring 32 by solder 38.

Figure 7:
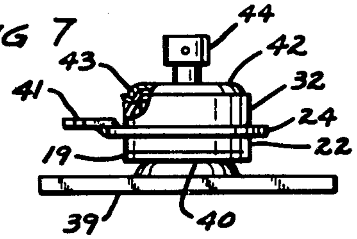
FIGURE 7 is a side view partially broken away, showing a complete unit embodying the housing of FIGURE 6.

FIGURE 7 shows the completion of the assembly which is carried out by attaching a conducting plate 39, preferably of copper, to the bottom of plate 19. The plate 39 may be a circular plate provided with a centrally raised boss having a flat top 40 attached to plate 19 as by solder (not shown). A terminal lug 41 is attached to the base connection 24 as by soldering, and an inverted cup-shaped electrode 42 provided with a depending circular rim 43 is fastened to the member 34 by insertion of the rim 43 within the bead 38 and attachment by solder. A suitable terminal lug 44 is attached to the member 42.

It will be recognized that terminal lug 44 is the emitter terminal, plate 39 is the collector terminal, and lug 41 is the base terminal of the transistor. In this construction, the principal current flow occurs in the central region between the emitter and collector stems 30 and 26; and in consequence, most of the heat is developed in this region. By reason of the fact that the silicon wafer is thin at this point and that a substantial bulk of molybdenum 30 and 26 is attached to it and to copper members 19 and 34, these members constitute a heat sink to readily conduct the heat away.

It should be understood that where molybdenum is specified for a part in this specification, some other electrical conductor could be used instead; but molybdenum is preferred because its temperature characteristics are similar to those of silicon. Where solder is shown or specified, a silver solder or silver copper solder is preferred, although some other type of solder may be used instead.

Figure 8:
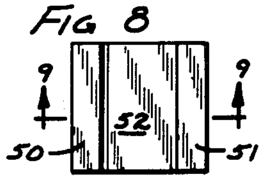
FIGURE 8 is a face view of another form of semi-conductor wafer useful in the practice of the invention.
Figure 9:
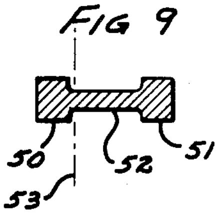
FIGURE 9 is a cross-section taken at line 9—9 of FIGURE 8.

FIGURES 8 and 9 show a variation of the form of the semi-conductor wafer. The semi-conductor, instead of being circular as in the case of FIGURES 1 and 2, is square or rectangular in its top view and it has an I cross section. When formed into a transistor wafer in a manner described in connection with the circular element above, there will result a wafer whose cross section appears as in FIGURE 5, but it will be understood that the wafer is square or rectangular instead of circular. Such a wafer can be assembled in a housing in the manner described in connection with FIGURE 6. The housing may have a square or rectangular shape, as viewed from the top in conformance with the square or rectangular shape of the wafer, but it may as well if desired have a circular shape as shown in FIGURES 6 and 7. In such case, the member 24 will have its interior portion designed to accommodate the square or rectangular shape of the wafer, and the portions of elements 26 and 30 which establish contact with the wafer, may also be made square or rectangular, if desired.

Figure 10:
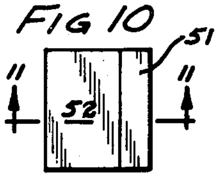
FIGURE 10 is a face view showing another form of semi-conductor wafer useful in the practice of the invention.
Figure 11:
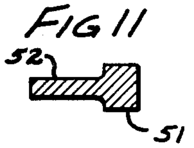
FIGURE 11 is a cross-section view taken at line 11—11 of FIGURE 10.
Figure 12:
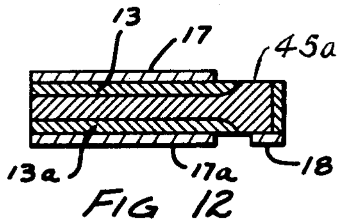
FIGURE 12 is a cross-section view of a transistor element including further application of metals to the arrangement of FIGURES 10 and 11.

FIGURES 10 and 11 show a modification of the form of FIGURES 8 and 9, and show in effect the portion to the right of the line 53 in FIGURE 9. Thus, the semi-conductor crystal of FIGURES 10 and 11 has only a single ridge 51 and a web 52. When processed as described in connection with FIGURES 1 to 8, there will result a transistor wafer 45*a* in the form of FIGURE 12; and the same numbered parts represent similar elements in FIGURES 5 and 12, it being understood that the parts in FIGURE 12 correspond in shape to the view in FIGURE 10. The cross section shown in FIGURE 12 is the same as the cross section of the transistor wafer made from the crystal of FIGURES 8 and 9, except that the ridge 50 and its associated parts are absent in FIGURE 12. The arrangement of a housing for the transistor wafer of FIGURE 12 can readily be assembled according to the procedure described in connection with FIGURE 6 and FIGURES 8 and 10. As indicated above, the top view of such a housing may be square, or rectangular or circular, as desired; and in the event of a circular type housing, it may be as shown in FIGURES 6 and 7, it being understood that the element 24 of FIGURE 6 will now be in contact only with the element 18 at the one side instead of on two sides of the wafer.

Figure 13:
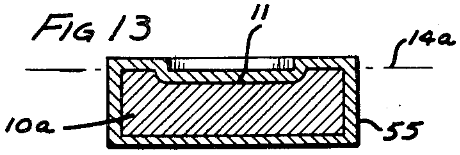
FIGURE 13 is a cross-section view showing another form of doped semi-conductor wafer useful in the practice of this invention.
Figure 14:
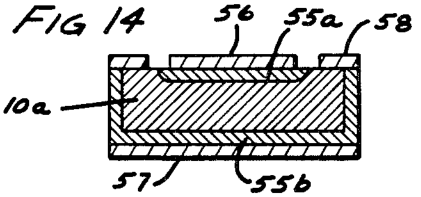
FIGURE 14 is a cross-section view showing the addition of metal contacting portions to the wafer of FIGURE 13.
Figure 15:
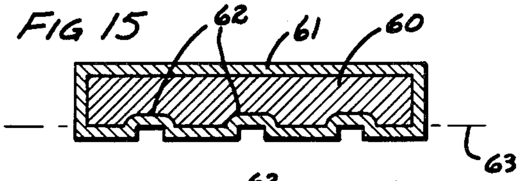
FIGURE 15 is a cross-section view of another form of doped semi-conductor wafer useful in the practice of this invention.

In the embodiments described above, all of the crystal elements such as 10 have been shown with depressions on both sides of the wafer or disc, these depressions being numbered 11 and 12 in FIGURES 1 and 2. It should be understood, however, that it is not always essential to have a depression on both sides; although the depression on both sides may have advantages for purposes of symmetry and reduction of stresses and various other reasons. An arrangement having a depression on only one side is shown in FIGURES 13 and 14. In FIGURE 13 there is shown a crystal element 10*a*, in the form of a circular disc which is like the element 10 of FIGURES 1 and 2, except that there is a depression or groove 11 on one side, but no such depression on the other side. After the phosphorous treatment, it has the phosphor-containing layer 55; and when the portion above line 14*a* is removed, there results the structure shown in FIGURE 14 wherein that portion of layer 55 in groove 11 is designated 55*a* and that portion of layer 55 at the opposite side of the wafer from groove 11 is designated 55*b*.

The application of a layer of molybdenum 56 over layer 55*a* and of another layer of molybdenum 57 over layer 55*b*, and of the rings 58 of molybdenum over the silicon creates the transistor. To use the transistor to best advantage, the element 56 should be the emitter contact, the element 57 the collector contact, and the element 58 the base contact. Since most heat will be developed at the region of the collector, the collector should preferably be opposite both the base and the emitter contact. It will be recognized that this arrangement does not fit precisely the housing construction shown in FIGURE 6 which would require the transistor of FIGURE 14 to be inverted to its position in FIGURE 14, in order to establish the contacts shown in FIGURE 6. As indicated above, it may if desired be used in this manner. Preferably however, it should be applied to the housing as it is oriented in FIGURE 14, which would require that the contacting elements 24 of FIGURE 6 be placed above the wafer so that the bottom of element 24 can be soldered to the top of element 58.

Figure 16:
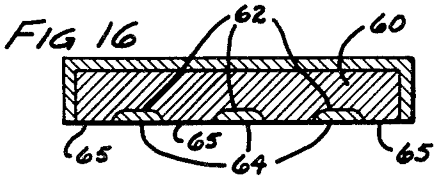
FIGURE 16 shows the wafer of FIGURE 15 with portions thereof removed.

FIGURES 15 to 21 show the construction of another form of transistor according to this invention. It comprises a square or rectangular wafer 60 which may be of P-type silicon; and it is provided with a doped layer 61 which may embody phosphorous to create N-type material in layer 61, as explained heretofore. One side of the wafer is provided with a number of linear grooves 62 so that the surface layer 61 extends into these grooves as shown. Upon lapping off the material below the line 63, there results the structure of FIGURE 16 wherein the grooves 62 contain the material of layer 61, which in FIGURE 16 is designated 64. This leaves the bottom surface of the wafer with alternate strips 64 of N-type silicon separated by alternate strips 65 of P-type regions of silicon. A layer 66 of metal, preferably molybdenum, is applied to the upper layer 61 of N-type silicon, and strips 67 also of molybdenum are applied over the strips 64 of N-type silicon. Likewise, similar strips 68 of molybdenum are applied over the strips 65. Space is left between the alternate strips 67 and 68 to prevent short circuiting. The strips 68 in contact with the P-type material of the wafer constitute base contacts while the strips 67 constitute emitter contacts, the collector contact being the material 66.

Figure 19:
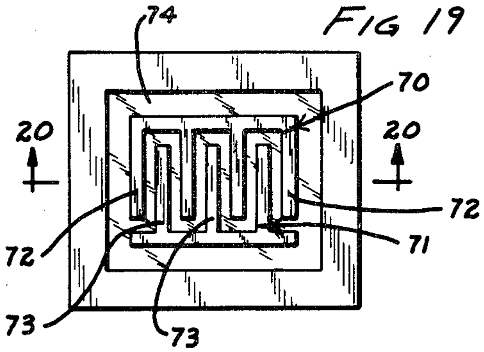
FIGURE 19 is a plan view showing a contacting means for the transistor element of FIGURES 17 and 18.
Figure 20:
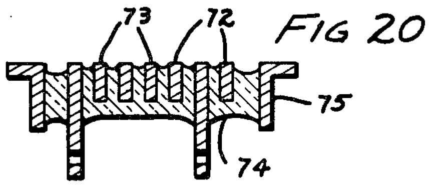
FIGURE 20 is a cross-section view taken at line 20—20 of FIGURE 19.

For the purpose of making suitable connection to these contact elements of the transistor, there is provided a grid arrangement as shown in FIGURES 19 and 20. This comprises a base grid 70 for making connection with the base strips 68, and an emitter grid 71 for making connection with the emitter strips 67. The base grid 70 comprises a number of parallel legs or strips 72 spaced in accordance with the dimensions of the base strips 68 on the transistor; and the emitter grid 71 comprises parallel legs or strips 73 spaced to conform with the dimensions and spacing of the emitter strips 67. These grids 70 and 71 are embedded in a matrix of electrical insulating material such as glass 74 contained within a suitable frame 75, in such a manner that the top edges of the strips 72 and 73 protrude from the glass as shown in FIGURE 20.

Figure 17:
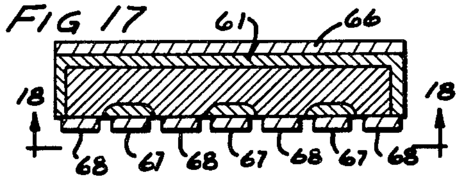
FIGURE 17 is a cross-section view showing the wafer of FIGURE 16 with metal contacting material added.
Figure 18:
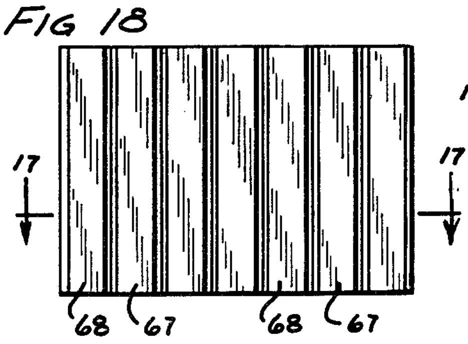
FIGURE 18 shows a bottom view of the element of FIGURE 17.
Figure 21:
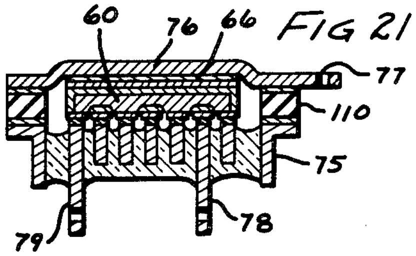
FIGURE 21 is a cross-section view showing an assembly of the transistor of FIGURE 17 with its contacting members.

FIGURE 21 shows an assembly of the transistor element of FIGURES 17 and 18 in a housing. A metallic cover member 76 is placed over and in contact with the collector contacting material 66, and the grid structure of FIGURE 19 is placed beneath the transistor so that the base and emitter contacting members of the grid are in contact with the respective base and emitter strips on the transistor. The frame 75 is fastened to the cover 76 in a suitable manner (not shown) and an insulating material 110 is placed therebetween to prevent short-circuiting from the collector to the base and emitter. Connection may be made at 77 for the collector, at lug 78 for the emitter and at lug 79 for the base.

In FIGURE 21 the layer shown between the cover 76 and the top of the transistor unit is solder and the layers shown between the grid legs and the corresponding emitter and base connection of the transistor are also solder.

Although the components in FIGURES 15 to 21 represent the transistor element as being rectangular or square, it will be recognized that some other shape could be used.

Figure 22:
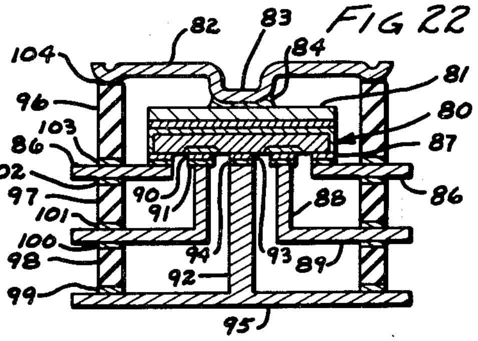
FIGURE 22 is a cross-section view showing another transistor housing and mounting arrangement according to the invention.

FIGURE 22 shows another form of transistor assembly embodying the invention. This comprises a transistor wafer 80, which may be constructed in a similar manner to that described in connection with the transistor of FIGURE 17; and it may be of any desired shape, although preferably the shape will be circular in its plan view. The contacting metal 81, preferably molybdenum, is soldered to a top cover member 82 having a central depression 83 at which point the solder 84 is applied. An annular disc 86 acts as the base contactor and is soldered to the outer base contact 87. A cylinder 88 provided with an annular flange 89 serves as the emitter contactor and makes contact with the circular emitter contact 90 by suitable solder 91. A central element 92 acts as a contactor for a central base contact 93 to which it is attached by solder 94; and this central contactor 92 is attached to a circular lower plate 95.

The contactors 82, 86, 89 and 95 are held and mounted in a housing arrangement comprising cylindrical insulator members 96, 97 and 98. The lower member 95 is soldered at 99 to insulator 98, the upper end of which is soldered at 100 to the emitter contactor 89 which in turn is soldered at 101 to the cylindrical insulator 97. The upper end of insulator 97 is in turn soldered at 102 to the base contactor 86 which in turn is soldered at 103 to the insulator member 96. The upper end of this is soldered at 104 to member 82.

It is noted that in the various figures, the phosphorous doped layer is shown as existing around the edges and sides of the wafer. It is immaterial for purposes of operation whether these phosphorous doped edge regions are allowed to remain or whether they are removed.

It should also be recognized that dimensions and thicknesses of layers shown in the drawings do not necessarily represent proportionate dimensions or thicknesses as they will occur in the actual construction. Many of the thicknesses are shown exaggerated for ease of illustration.

It should be understood that the invention is not limited to the specific embodiments and arrangements and selections of materials shown in the accompanying drawings and described in connection therewith, as these are given by way of illustration rather than by way of limitation. Many modifications from the precise arrangements shown and described may be made within the scope of the invention. For example, it is not essential that prosphorous be used as the doping material for the P-type silicon for forming the P-N junctions. Other substances, for example arsenic, are known to be useful for the purpose and may be used in place of phosphorous.

Furthermore, the invention is limited to the use of a

P-type silicon wafer. An N-type silicon could be used instead for the transistor semi-conductor material, if desired, in which case the doping material to be selected for creating the P–N junctions will be a material which will create P-type silicon. A well-known material for making a P-type surface layer on N-type silicon is boron which may be introduced in a well-known manner. Other doping materials for N-type silicon which may be used in place of boron are gallium and aluminum.

It is furthermore understood that the same conductor material is not necessarily limited to silicon, as other semiconductor material such as germanium, capable of creating P–N junctions, may be used. Moreover, it should be noted that where specific metals have been mentioned in the description hereinabove, other suitable metal may be substituted. For example, instead of the use of molybdenum, there may be used tantalum or tungsten.

In case an N-type wafer is started with instead of the P-type wafer described hereinabove, the P–N junctions will simply be reversed from the arrangements illustrated and described hereinabove. That is, instead of having the conductivity types in the order of N–P–N from collector to emitter, as in the illustrated embodiments, the order will be P–N–P.

In this specification the terms N–type and P–type have been used in the conventional sense to designate the two opposite conductivity types. The N-type semi-conductor is one having an excess of electrons and the P–type, an excess of holes. The theory of these opposite conductivity types and their effects at P–N junctions has been fully expounded in the technical literature and needs no discussion here.

Although I have described preferred embodiments of my novel invention, many variations and modifications will now be obvious to those skilled in the art, and I prefer therefore to be limited not by the specific disclosure herein but only by the appended claim.

I claim:

The method of making a semiconductive device having junctions therein which comprises forming a plurality of depressions in the surface of a wafer of semiconductive material having a predetermined conductivity type, doping said surface of semiconductive material to form a surface layer of conductivity type opposite that of said predetermined conductivity type to form a P–N junction at said surface, and removing at least portions of the surface material of said wafer surrounding said depressions to expose regions of said predetermined conductivity type at said surface within said depressions, said regions being separated from one another and thereafter applying a first conductive electrode to the surface of said exposed regions, and applying a second conductive electrode separated from said first conductive electrode to the surface regions in said depressions.

References Cited by the Examiner

UNITED STATES PATENTS

| | | | |
|---|---|---|---|
| 2,618,690 | 11/1952 | Stuetzer. | |
| 2,721,965 | 10/1955 | Hall. | |
| 2,854,366 | 9/1958 | Wannlund | 148—1.5 |
| 2,952,896 | 9/1960 | Cornelison. | |
| 2,967,344 | 1/1961 | Mueller. | |
| 2,980,830 | 4/1961 | Shockley. | |
| 3,020,412 | 2/1962 | Byczkowski | 148—1.5 |
| 3,022,568 | 2/1962 | Nelson | 317—235 |
| 3,054,034 | 9/1962 | Nelson. | |
| 3,108,914 | 10/1963 | Hoerni | 148—186 |
| 3,109,760 | 11/1963 | Goetzberger | 148—186 |

FOREIGN PATENTS

| | | |
|---|---|---|
| 1,024,640 | 2/1958 | Germany. |

JOHN F. CAMPBELL, *Primary Examiner.*

DAVID J. GALVIN, RICHARD H. EANES, Jr., *Examiners.*